US012597480B2

(12) United States Patent
Zhang et al.

(10) Patent No.: US 12,597,480 B2
(45) Date of Patent: Apr. 7, 2026

(54) MEMORY DEVICE, AND MEMORY SYSTEM AND OPERATION METHOD THEREOF

(71) Applicant: YANGTZE MEMORY TECHNOLOGIES CO., LTD., Wuhan (CN)

(72) Inventors: Feiyang Zhang, Wuhan (CN); Hongwen Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 96 days.

(21) Appl. No.: 18/409,241

(22) Filed: Jan. 10, 2024

(65) Prior Publication Data

US 2025/0104795 A1 Mar. 27, 2025

(30) Foreign Application Priority Data

Sep. 25, 2023 (CN) .......................... 202311253985.4

(51) Int. Cl.
*G11C 29/00* (2006.01)
*G11C 29/52* (2006.01)
*G06F 11/10* (2006.01)
*G11C 29/04* (2006.01)

(52) U.S. Cl.
CPC ............ *G11C 29/52* (2013.01); *G11C 29/789* (2013.01); *G06F 11/10* (2013.01); *G11C 2029/0411* (2013.01)

(58) Field of Classification Search
CPC ....... G11C 29/52; G11C 29/89; G11C 29/789; G11C 2029/0411; G06F 11/10
USPC ..................................................... 365/185.09
See application file for complete search history.

(56) References Cited

U.S. PATENT DOCUMENTS

| | | | |
|---|---|---|---|
| 2017/0109232 A1* | 4/2017 | Cha .......................... | G11C 29/52 |
| 2020/0097361 A1* | 3/2020 | Suh ........................... | G11C 7/06 |
| 2023/0195567 A1* | 6/2023 | Bueb .................. | H03M 13/2909 |
| | | | 714/755 |

* cited by examiner

*Primary Examiner* — Ly D Pham
(74) *Attorney, Agent, or Firm* — Conley Rose, P.C

(57) ABSTRACT

Examples of the present disclosure provide a memory device, a memory system and an operation method of the memory system, and a storage medium. The memory device includes: multiple word lines, where a plurality of strings coupled to each of the word lines are divided into a first string area and a second string area; and at least one redundant stripe corresponding to each of the word lines, where the redundant stripe comprises a first redundant stripe which is configured to store first check data. The first check data is obtainable by performing error correction coding on data in a first string area of a word line where the first redundant stripe is located and data in a second string area of a word line adjacent to the word line where the first redundant stripe is located.

20 Claims, 11 Drawing Sheets

<u>100</u>

301

308

413

403

411

412

410

414

401

601

| | | X | X | X | X |
|---|---|---|---|---|---|
| WL0 | | X | X | X | X |
| | | X | X | X | X |
| | | X | X | X | X |
| | | X | X | X | X |
| | | X | X | X | P |

......

| | | X | X | X | X |
|---|---|---|---|---|---|
| WLN | | X | X | X | X |
| | | X | X | X | X |
| | | X | X | X | X |
| | | X | X | X | X |
| | | X | X | X | P |

| | | Cell1 | Cell2 | Cell3 | Cell4 |
|---|---|---|---|---|---|
| | Str0 | X1 | X2 | X3 | P0 |
| | Str1 | X1 | X2 | X3 | P0 |
| WL0 | Str2 | X1 | X2 | X3 | P0 |
| | Str3 | X1 | X2 | X3 | P0 |
| | Str4 | X1 | X2 | X3 | P0 |
| | Str5 | X1 | X2 | X3 | P0 |
| | | | ...... | | |
| | Str0 | X1 | X2 | X3 | P0 |
| | Str1 | X1 | X2 | X3 | P0 |
| WLN | Str2 | X1 | X2 | X3 | P0 |
| | Str3 | X1 | X2 | X3 | P0 |
| | Str4 | X1 | X2 | X3 | P0 |
| | Str5 | X1 | X2 | X3 | P0 |

FIG. 6B

MEMORY DEVICE, AND MEMORY SYSTEM AND OPERATION METHOD THEREOF

CROSS-REFERENCE TO RELATED APPLICATIONS

The present application claims priority to Chinese Patent Application No. 2023112539854, which was filed Sep. 25, 2023, is titled "MEMORY DEVICE, MEMORY SYSTEM AND OPERATING METHOD THEREOF, STORAGE MEDIUM," and is hereby incorporated herein by reference in its entirety.

TECHNICAL FIELD

The present disclosure relates to the field of semiconductor technologies, and in particular, to a memory device, a memory system and an operation method thereof, and a storage medium.

BACKGROUND

Non-volatile memory devices such as three-dimensional NAND type memory with low power consumption, light weight and good performance have been widely used in electronic products. However, there are still many issues that are to be solved when performing a reading operation on a memory device in the related art.

SUMMARY

In examples, a memory device comprises a plurality of word lines, wherein a plurality of strings coupled to each of the word lines are divided into a first string area and a second string area; and at least one redundant stripe corresponding to each of the word lines, wherein the redundant stripe comprises a first redundant stripe which is configured to store first check data, wherein the first check data is obtainable by performing error correction coding on data in a first string area of a word line where the first redundant stripe is located and data in a second string area of a word line adjacent to the word line where the first redundant stripe is located.

In examples, the redundant stripe further comprises a second redundant stripe which is configured to store second check data, wherein the second check data is obtainable by performing error correction coding on one of data in a first string area or data in a second string area of a word line where the second redundant stripe is located.

In examples, a memory device comprises a 0th word line to an Nth word line numbered according to physical locations, wherein the memory device is sequentially programmed from the 0th word line to the Nth word line, and wherein N is an integer greater than 1; the 0th word line corresponds to one second redundant stripe, and the second check data is obtainable by performing error correction coding on data in a first string area of the 0th word line; each of the 1st to (N−1)th word lines corresponds to one first redundant stripe, and each of the first check data is obtainable by performing error correction coding on data in a first string area of a corresponding word line and data in a second string area of a preceding word line of the corresponding word line; and the Nth word line corresponds to one first redundant stripe and one second redundant stripe, the first check data is obtainable by performing error correction coding on data in a first string area of the Nth word line and data in a second string area of the (N−1)th word line, and the second check data is obtainable by performing error correction coding on data in a second string area of the Nth word line.

In examples, the 0th word line corresponds to a set of first start data and a set of second start data, wherein the first start data comprises data stored in a first memory cell of each string in a second string area of the 0th word line, and the second start data comprises data stored in a first memory cell of each string in the first string area of the 0th word line; each of the 1st to (N−1)th word lines corresponds to a set of the first start data, wherein each set of the first start data comprises data stored in a first memory cell of each string in a second string area of a corresponding word line; and the Nth word line corresponds to a set of the second start data, wherein the second start data comprises data stored in a first memory cell of each string in the second string area of the Nth word line.

In examples, a memory device comprises a 0th word line and a 1st word line numbered according to physical locations; the 0th word line corresponds to one second redundant stripe, and the second check data is obtainable by performing error correction coding on data in a first string area of the 0th word line; and the 1st word line corresponds to one first redundant stripe and one second redundant stripe, the first check data is obtainable by performing error correction coding on data in a first string area of the 1st word line and data in a second string area of the 0th word line, and the second check data is obtainable by performing error correction coding on data in a second string area of the 1st word line.

In examples, the number of strings in the first string area is the same as the number of strings in the second string area.

In examples, a memory device comprises (N+1) word lines, each of the word lines is coupled to M strings, and each of the strings comprises L memory cells, and wherein a ratio of the number of memory cells occupied by the redundant stripe to the number of memory cells is:

$$(N+2)(M/2)/(N+1)*M*L.$$

In examples, the first string area and the second string area coupled to each of the word lines are located in a same block.

In examples, the first string area and the second string area coupled to each of the word lines are located in different blocks, respectively.

In examples, a memory system comprises a memory device comprising: a plurality of word lines, wherein a plurality of strings coupled to each of the word lines are divided into a first string area and a second string area; and at least one redundant stripe corresponding to each of the word lines, wherein the redundant stripe comprises a first redundant stripe which is configured to store first check data, wherein the first check data is obtainable by performing error correction coding on data in a first string area of a word line where the first redundant stripe is located and data in a second string area of a word line adjacent to the word line where the first redundant stripe is located; and a memory controller coupled to the memory device and configured to: when a plurality of data errors occur in a plurality of strings coupled to one of the word lines, perform correction by using the first check data stored in a redundant stripe corresponding to a corresponding word line and the first check data stored in a redundant stripe corresponding to a word line adjacent to the corresponding word line.

In examples, the redundant stripe further comprises a second redundant stripe which is configured to store second check data, wherein the second check data is obtainable by performing error correction coding on one of data in a first string area or data in a second string area of a word line where the second redundant stripe is located; and the memory controller is further configured to: when a plurality of data errors occur in a plurality of strings coupled to one of the word lines, perform correction by using the second check data stored in a redundant stripe corresponding to a corresponding word line and the first check data stored in a redundant stripe corresponding to a word line adjacent to the corresponding word line, and perform correction by using the first check data and the second check data stored in a redundant stripe corresponding to a corresponding word line.

In examples, a memory system comprises a 0th word line to an Nth word line numbered according to physical locations, wherein the memory system is sequentially programmed from the 0th word line to the Nth word line, and wherein the N is an integer greater than 1; the 0th word line corresponds to one second redundant stripe, and the second check data is obtainable by performing error correction coding on data in a first string area of the 0th word line; each of the 1st to (N−1)th word lines corresponds to one first redundant stripe, and each of the first check data is obtainable by performing error correction coding on data in a first string area of a corresponding word line and data in a second string area of a preceding word line of the corresponding word line; and the Nth word line corresponds to one first redundant stripe and one second redundant stripe, the first check data is obtainable by performing error correction coding on data in a first string area of the Nth word line and data in a second string area of the (N−1)th word line, and the second check data is obtainable by performing error correction coding on data in a second string area of the Nth word line.

In examples, the 0th word line corresponds to a set of first start data and a set of second start data, wherein the first start data comprises data stored in a first memory cell of each string in a second string area of the 0th word line, and the second start data comprises data stored in a first memory cell of each string in the first string area of the 0th word line; each of the 1st to (N−1)th word lines corresponds to a set of the first start data, wherein each set of the first start data comprises data stored in a first memory cell of each string in a second string area of a corresponding word line; and the Nth word line corresponds to a set of the second start data, wherein the second start data comprises data stored in a first memory cell of each string in the second string area of the Nth word line.

In examples, a memory system comprises a 0th word line and a 1st word line numbered according to physical locations; the 0th word line corresponds to one second redundant stripe, and the second check data is obtainable by performing error correction coding on data in a first string area of the 0th word line; and the 1st word line corresponds to one first redundant stripe and one second redundant stripe, the first check data is obtainable by performing error correction coding on data in a first string area of the 1st word line and data in a second string area of the 0th word line, and the second check data is obtainable by performing error correction coding on data in a second string area of the 1st word line.

In examples, the number of strings in the first string area is the same as the number of strings in the second string area.

In examples, a memory system comprises (N+1) word lines, each of the word lines is coupled to M strings, and each of the strings comprises L memory cells, and wherein a ratio of the number of memory cells occupied by the redundant stripe to the number of memory cells is:

$$(N + 2)(M/2)/(N + 1) * M * L.$$

In examples, the first string area and the second string area coupled to each of the word lines are located in a same block.

In examples, an operation method of a memory system is disclosed. The memory system comprises a memory device comprising: a plurality of word lines, wherein a plurality of strings coupled to each of the word lines are divided into a first string area and a second string area; and at least one redundant stripe corresponding to each of the word lines, wherein the redundant stripe comprises a first redundant stripe which is configured to store first check data, wherein the first check data is obtainable by performing error correction coding on data in a first string area of a word line where the first redundant stripe is located and data in a second string area of a word line adjacent to the word line where the first redundant stripe is located; and a memory controller coupled to the memory device, and wherein the operation method comprises: when a plurality of data errors occur in a plurality of strings coupled to one of the word lines, performing correction by using the first check data stored in a redundant stripe corresponding to a corresponding word line and the first check data stored in a redundant stripe corresponding to a word line adjacent to the corresponding word line.

In examples, the redundant stripe further comprises a second redundant stripe which is configured to store second check data, wherein the second check data is obtainable by performing error correction coding on one of data in a first string area or data in a second string area of a word line where the second redundant stripe is located; and the operation method comprises: when a plurality of data errors occur in a plurality of strings coupled to one of the word lines, performing correction by using the second check data stored in a redundant stripe corresponding to a corresponding word line and the first check data stored in a redundant stripe corresponding to a word line adjacent to the corresponding word line.

In examples, an operation method comprises performing correction by using the first check data and the second check data stored in a redundant stripe corresponding to a corresponding word line.

BRIEF DESCRIPTION OF THE DRAWINGS

FIG. 6A is a schematic structural diagram of a memory cell in which one page corresponds to one check data according to an example of the present disclosure;

FIG. 6B is a schematic structural diagram of a memory cell in which one page corresponds to multiple check data according to an example of the present disclosure;

Figure 1:
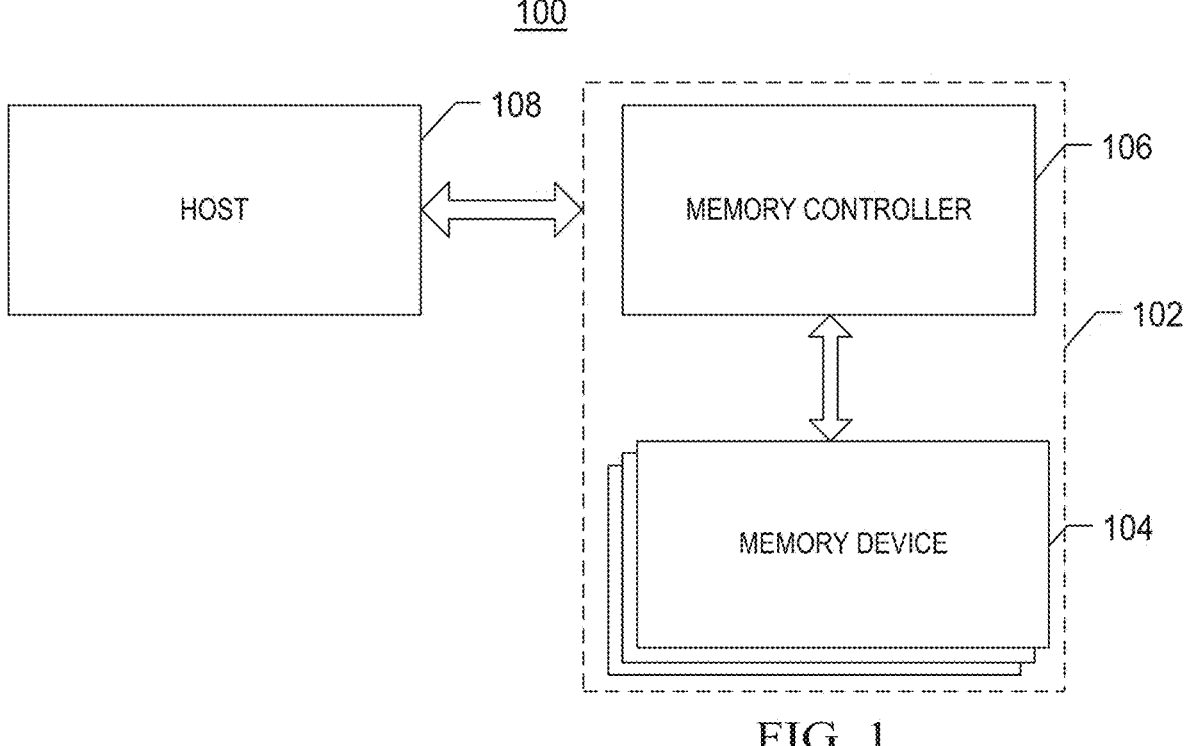
FIG. 1 is a schematic diagram of an example system with a memory system according to an example of the present disclosure.

In the above drawings (which are not drawn to scale), like reference numerals may describe like parts in the different views. Like reference numbers with different letter suffixes may indicate different examples of like parts. The drawings illustrate the various examples discussed herein, by way of example and not limitation.

DETAILED DESCRIPTION

Examples of the present disclosure will be described in more detail below with reference to the accompanying drawings. Although examples of the present disclosure are shown in the drawings, it should be understood that the present disclosure may be implemented in various ways and should not be limited to the DETAILED DESCRIPTION set forth herein. Rather, these examples are provided so that the present disclosure can be more thoroughly understood and the scope of the present disclosure can be fully conveyed to those skilled in the art.

In the following description, numerous specific details are given in order to provide a more thorough understanding of the present disclosure. It will be apparent, however, to one skilled in the art that the present disclosure may be practiced without one or more of these details. In other examples, some technical features well-known in the art are not described to avoid confusion with the present disclosure; that is, not all features of the actual example are described here, and well-known functions and structures are not described in detail.

In the drawings, the size of layers, regions, elements and their relative sizes may be exaggerated for clarity. Like reference numerals refer to like elements throughout.

It will be understood that when an element or layer is referred to as being "on," "adjacent to," "connected to" or "coupled to" other elements or layers, it can be directly on, adjacent to, connected to, or coupled to other elements or layers, or intervening elements or layers may be present. In contrast, when an element is referred to as being "directly on," "directly adjacent to," "directly connected to" or "directly coupled to" other elements or layers, there are no intervening elements or layers. It will be understood that, although the terms such as first, second, third etc. may be used to describe at least one of various elements, components, regions, layers or sections, at least one of these elements, components, regions, layers or sections should not be limited by these terms. These terms are only used to distinguish one element, component, region, layer or section from another element, component, region, layer or section. Thus, a first element, component, region, layer or section discussed below could be represented as a second element, component, region, layer or section without departing from the teachings of the present disclosure. When a second element, component, region, layer or section is discussed, it does not indicate that a first element, component, region, layer or section exists in the present disclosure.

Spatial relationship terms such as "under", "below", "beneath", "underneath", "on", "above" and so on, can be used here for convenience to describe the relationship between one element or feature and other elements or features shown in the figures. It will be understood that the spatially relationship terms also comprise different orientations of the device in use and operation in addition to the orientation depicted in the figures. For example, if the device in the figures is turned over, elements or features described as "below" or "underneath" or "under" other elements or features would then be oriented as "above" the other elements or features. Thus, the example terms "below" and "under" can comprise both orientations of above and below. The device may be otherwise oriented (rotated 90 degrees or at other orientations) and the spatial descriptors used herein may be interpreted accordingly.

The terminology used herein is for the purpose of describing particular examples only and is not to be taken as a limitation of the present disclosure. As used herein, "a", "an" and "said/the" in singular forms are intended to include the plural forms as well, unless the context clearly dictates otherwise. It should also be understood that "comprising", when used in this specification, identifies the presence of at least one of stated features, integers, operations, elements or components, but does not exclude the presence or addition of at least one of one or more other features, integers, operations, elements, components or groups. As used herein, the term "at least one of . . . " includes any and all combinations of the associated listed items.

For ease of understanding the characteristics and technical content of the examples of the present disclosure in more detail, the examples of the present disclosure will be described in detail below in conjunction with the accompanying drawings. The attached drawings are only for reference and description, and are not intended to limit the examples of the present disclosure.

The memory device in the examples of the present disclosure includes but is not limited to a three-dimensional NAND type memory, and for case of understanding, a three-dimensional NAND type memory is used as an example for illustration.

FIG. 1 illustrates a block diagram of an example system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from the memory device 104.

Memory controller 106 is coupled to the memory device 104 and host 108 and is configured to control the memory device 104, according to some examples. Memory controller 106 can manage the data stored in memory device 104 and communicate with host 108. In some examples, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some examples, memory controller 106 is designed for operating in a high duty-cycle environment, such as solid state disks (SSD) or embedded multi-media-cards (eMMCs) used as data storage for mobile devices, such as smartphones, tablets, laptop computers, etc., and enterprise storage arrays.

Memory controller 106 can be configured to control operations of the memory device 104, such as read, erase, and program operations. Memory controller 106 can also be configured to manage various functions with respect to the data stored or to be stored in the memory device 104 including, but not limited to bad-block management, garbage collection, logical-to-physical address conversion, wear leveling, etc. In some examples, memory controller 106 is further configured to process error correction codes (ECC) with respect to the data read from or written to the memory device 104. Any other suitable functions may be performed by memory controller 106 as well, for example, formatting the memory device 104. Memory controller 106 can communicate with an external device (e.g., host 108) according to a particular communication protocol. For example, memory controller 106 may communicate with the external device through at least one of various interface protocols, such as a USB protocol, a multi-media-card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2B:
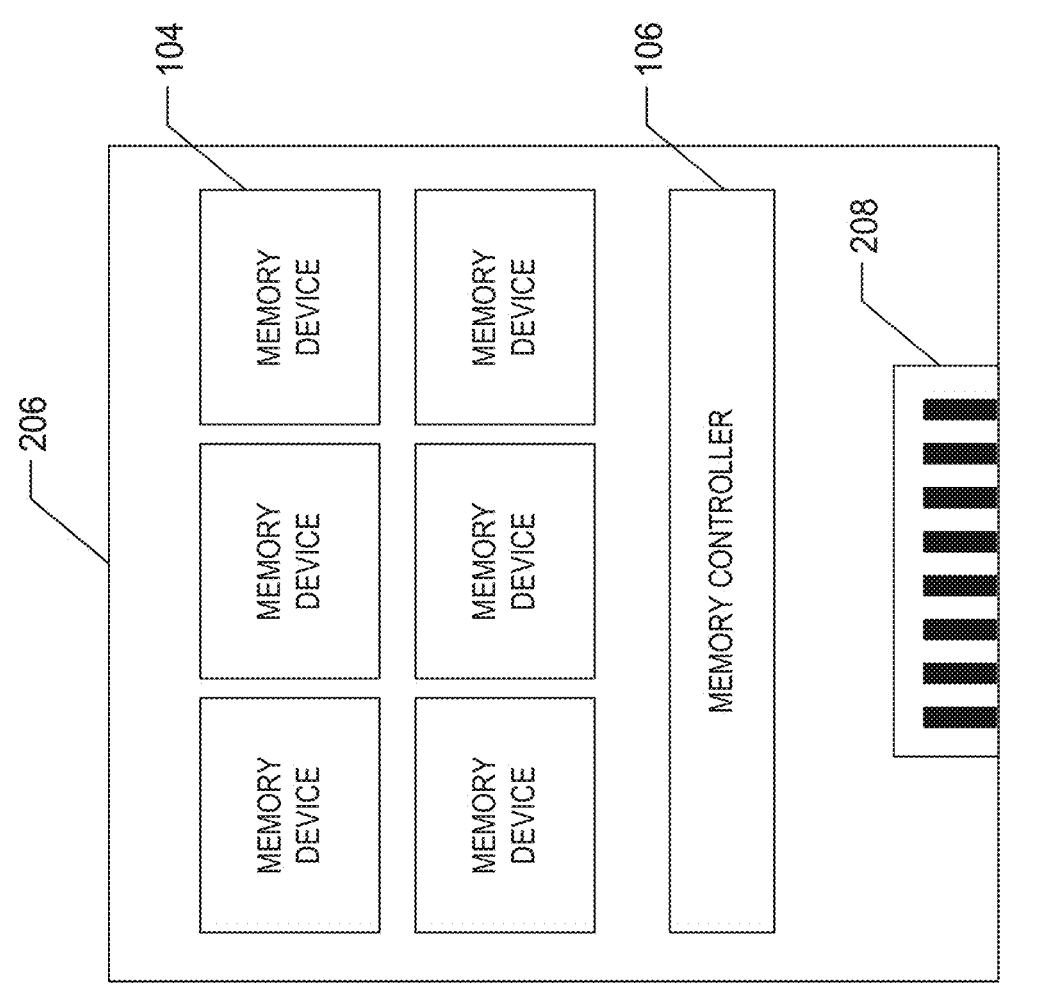
FIG. 2B is a schematic diagram of an example solid state drive with a memory system according to an example of the present disclosure.
Figure 2A:
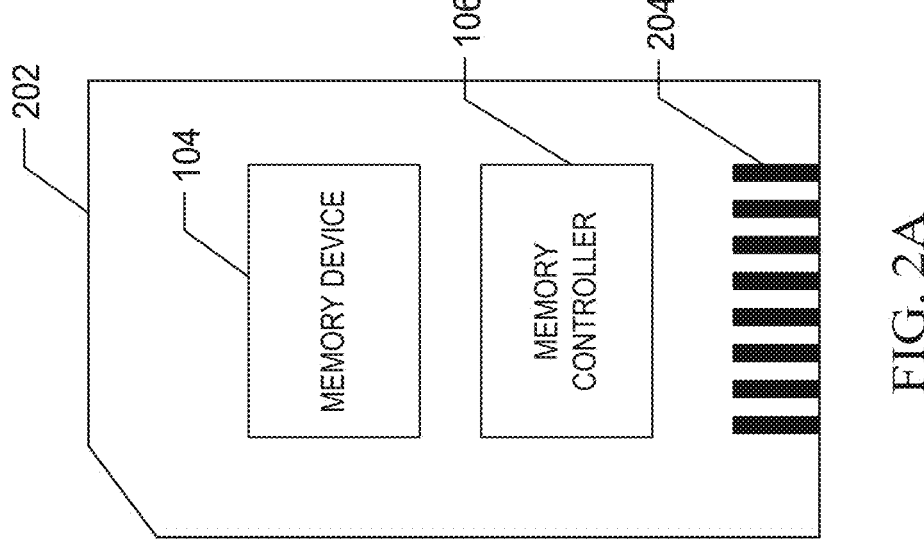
FIG. 2A is a schematic diagram of an example memory card with a memory system according to an example of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling the memory card 202 with a host (e.g., host 108 in FIG. 1). In another example as shown in FIG. 2B, the memory controller 106 and multiple memory devices 104 may be integrated into an SSD 206. SSD 206 can further include an SSD connector 208 coupling SSD 206 with a host (e.g., host 108 in FIG. 1). In some examples, at least one of the storage capacity or the operation speed of SSD 206 is greater than those of memory card 202.

Figure 3A:
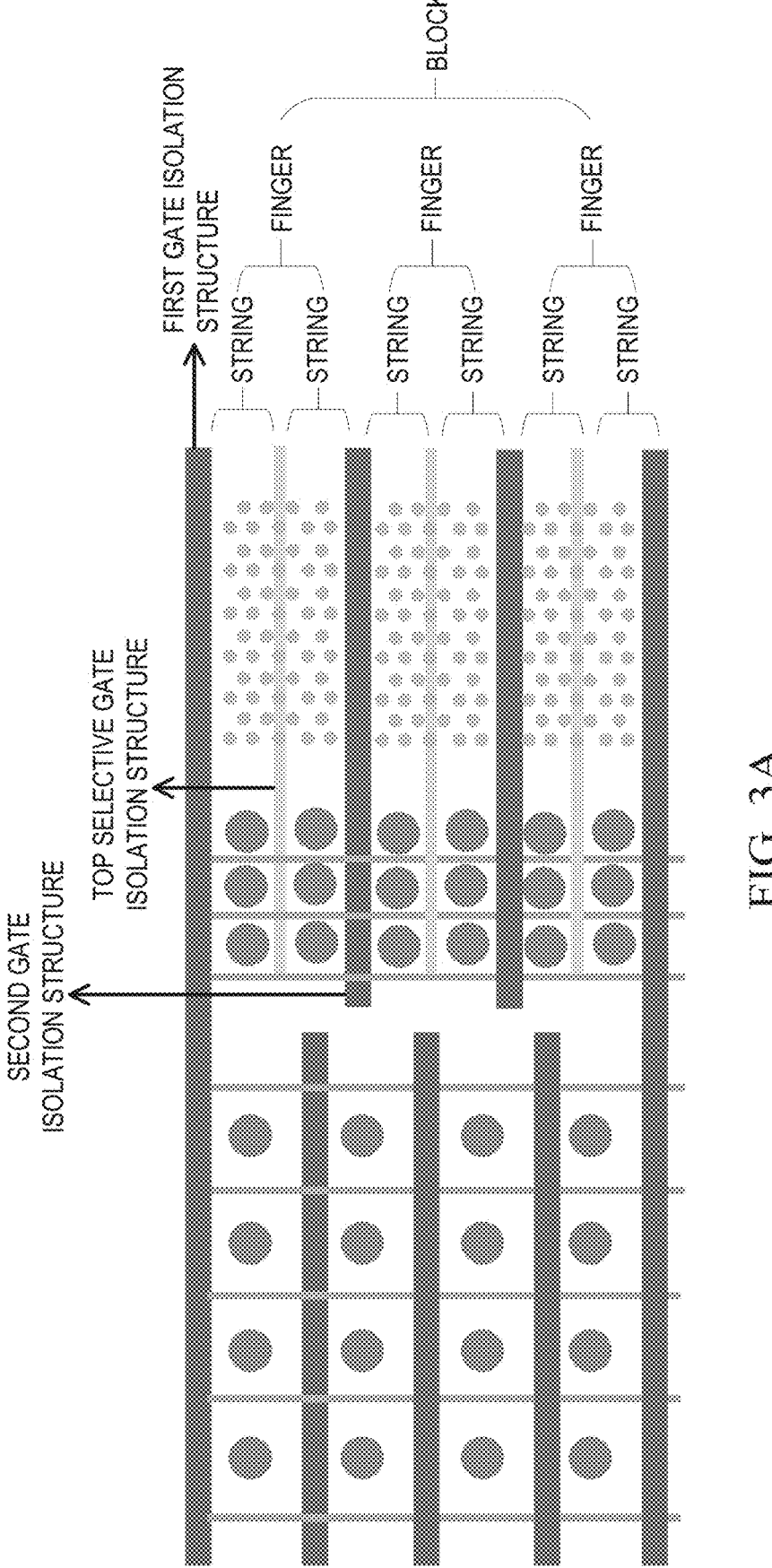
FIG. 3A is a schematic diagram of the distribution of memory cells of a three-dimensional NAND type memory according to an example of the present disclosure.

FIG. 3A provides a structural schematic diagram of a memory cell array of a three-dimensional NAND type memory. As shown in FIG. 3A, the memory cell array of a three-dimensional NAND type memory includes several memory cell rows parallel to a gate isolation structure and staggered in parallel. Every two rows of the memory cell rows are separated by a gate isolation structure and a top selective gate isolation structure, and each memory cell row includes a plurality of memory cells. The gate isolation structure may include a first gate isolation structure and a second gate isolation structure. The first gate isolation structure divides the memory cell array into a plurality of blocks, the plurality of second gate isolation structures can divide the blocks into multiple fingers, and the top selective gate isolation structure provided in the middle of each finger can divide the finger into two parts, so that the finger is divided into two strings. A block shown in FIG. 3A contains 6 strings, and in practical applications, the number of strings in a block is not limited to this.

In some examples, each block can be coupled to multiple word lines, and multiple memory cells coupled to each individually controlled word line form a page. By way of example, all the memory cells in each string in FIG. 3A are coupled to form a page.

It should be noted that the number of memory cell rows between the gate isolation structure and the top selective gate isolation structure shown in FIG. 3A is merely an example, and is not used for limiting the number of memory cell rows contained in one finger of the three-dimensional NAND type memory in the present disclosure. In practical applications, the number of memory cell rows contained in one finger can be adjusted according to actual conditions, such as 2, 4, 8, 16, and so on.

Figure 3B:
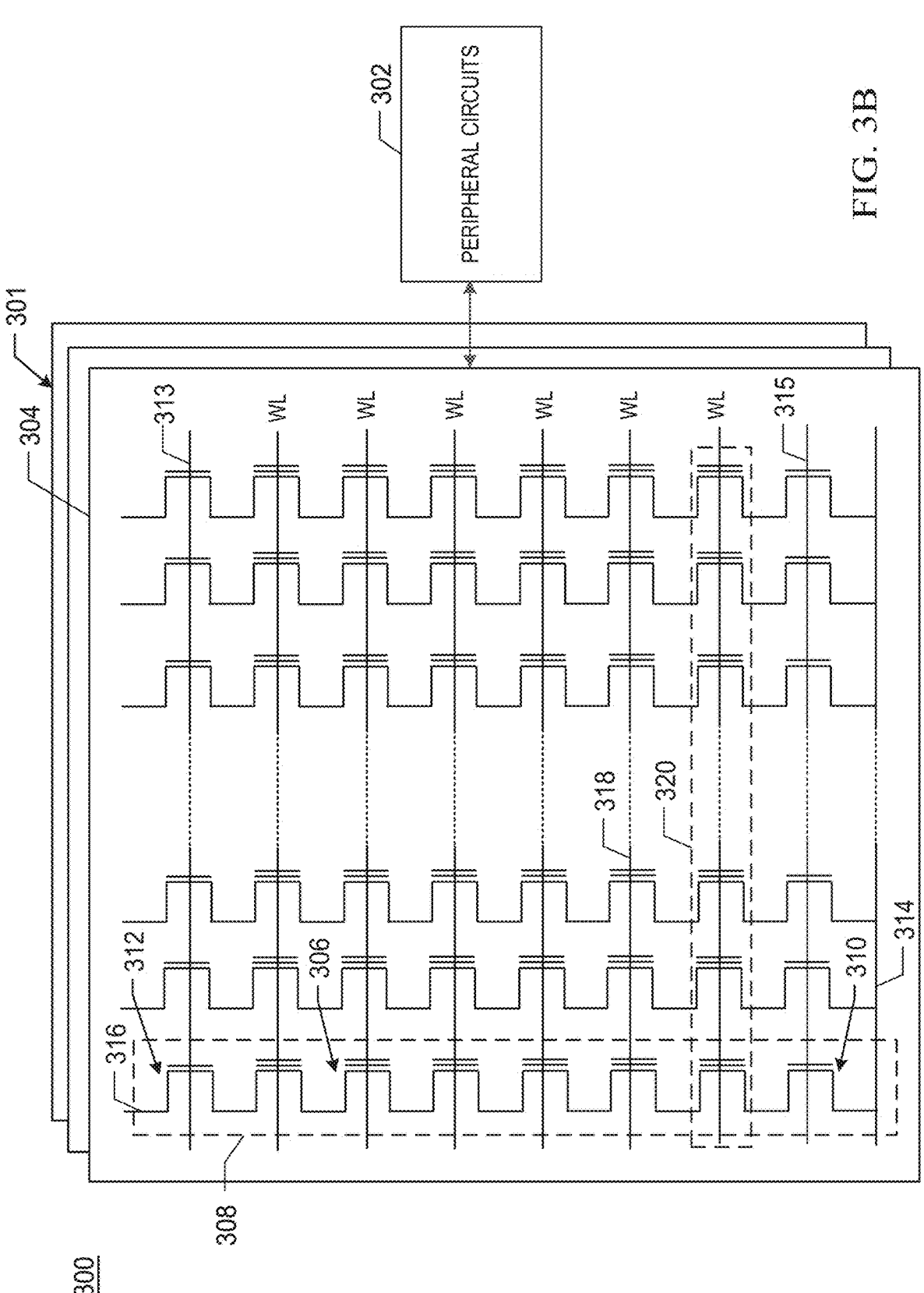
FIG. 3B is a schematic diagram of an example memory including peripheral circuits according to an example of the present disclosure.

FIG. 3B illustrates a schematic circuit diagram of an example memory device 300 including peripheral circuits, according to some aspects of the present disclosure. The memory device 300 can be an example of the memory device 104 in FIG. 1. The memory device 300 can include a memory cell array 301 and peripheral circuits 302 coupled to memory cell array 301. The memory cell array 301 is illustrated as an example of a three-dimensional NAND type memory cell array, in which memory cells 306 are NAND type memory cells and are provided in the form of an array of strings 308 each extending vertically above a substrate (not shown). In some examples, each string 308 includes a plurality of memory cells 306 coupled in series and stacked vertically. Each memory cell 306 can hold a continuous, analog value, such as an electrical voltage or charge, that depends on the number of electrons trapped within a region of the memory cell 306. Each memory cell 306 can be either a floating gate type of memory cell including a floating-gate transistor or a charge trap type of memory cell including a charge-trap transistor.

In some examples, each memory cell 306 is a single-level cell (SLC) that has two possible memory states and thus, can store one bit of data. For example, the first memory state "0" can correspond to a first range of voltages, and the second memory state "1" can correspond to a second range of voltages. In some examples, each memory cell 306 is a multi-level cell (MLC) that is capable of storing more than a single bit of data in more than four memory states. For example, the MLC can store two bits per cell (also known as Double-Level Cell), three bits per cell (also known as Trinary-Level cell (TLC)), four bits per cell (also known as a Quad-Level cell (QLC)), five bits per cell (also known as a Penta-Level cell (PLC)) or more than five bits per cell. Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3B, each string 308 can include a bottom selective transistor 310 (also referred to as a source selective transistor BSG, which includes a source selective gate) at its source end and a top selective transistor 312 (also known as a drain selective transistor TSG, which includes a drain selective gate) at its drain end. Source selective transistor BSG 310 and drain selective transistor TSG 312 can be configured to activate selected strings 308 during read and program operations. In some examples, the sources of strings 308 in the same block 304 are coupled through the same source line (SL) 314, e.g., a common SL. In other words, all strings 308 in the same block 304 have an array common source (ACS), according to some examples. TSG 312 of each string 308 is coupled to a respective bit line (BL) 316 from which user data can be read or written via an output bus (not shown), according to some examples. In some examples, each string 308 is configured to be selected or deselected by at least one of: applying a select voltage (e.g., above the threshold voltage of the transistor having TSG 312) or a deselect voltage (e.g., 0 V) to respective TSG 312 through one or more TSG lines 313 or applying a select voltage (e.g., above the threshold voltage of the transistor having BSG 310) or a deselect voltage (e.g., 0 V) to respective BSG 310 through one or more BSG lines 315.

As shown in FIG. 3B, the strings 308 can be organized into multiple blocks 304, each of which can have a common source line 314, e.g., coupled to the ground. In some examples, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block. Memory cells 306 of adjacent strings 308 can be coupled through word lines 318 that select which row of memory cells 306 is affected by read and program operations. In some examples, with reference to FIG. 3A above, the plurality of memory cells are isolated by the top selective gate isolation structure and the gate isolation structure. The multiple memory cells between the top selective gate isolation structure and the gate isolation structure are arranged into multiple memory cell rows, and each memory cell row is parallel to the gate isolation structure and the top selective gate isolation structure. Memory cells in strings that share the same word line form a physical page 320, and each physical page 320 can be mapped to at least one logical page based on the storage mode (for example SLC or MLC as mentioned above) of the corresponding memory cell 306. A logical page can constitute the basic data unit for program operations and read operations.

Referring to FIG. 3A and FIG. 3B, each memory cell 306 of the plurality of memory cells is coupled to respective word lines 318, and each string 308 is coupled to respective bit lines 316 via a respective selective transistor (such as top selective transistor (TSG) 312).

Figure 4:
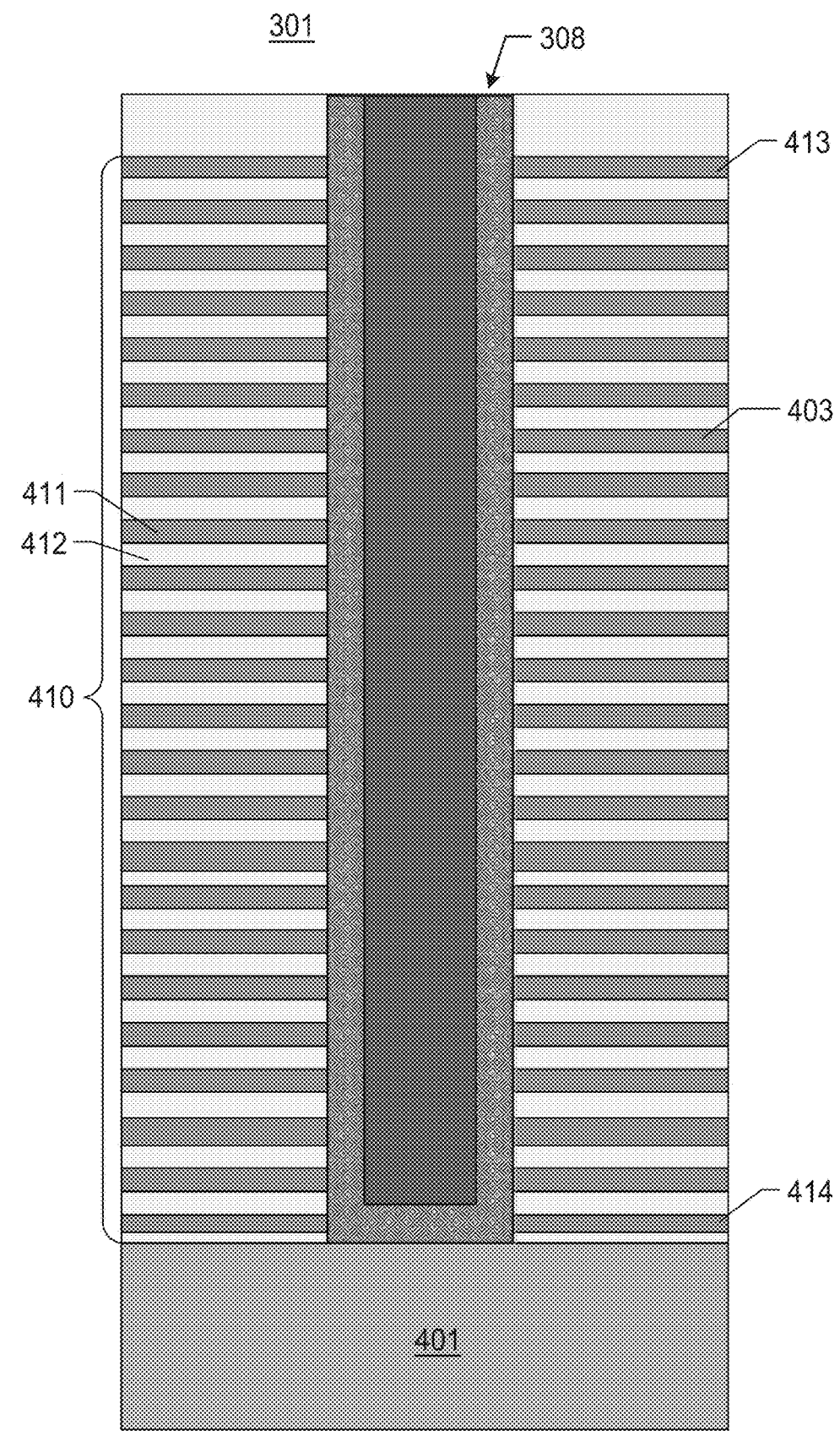
FIG. 4 is a schematic cross-sectional view of a memory cell array including NAND type strings according to an example of the present disclosure.

FIG. 4 shows a schematic cross-sectional view of an example memory cell array 301 including strings 308, exemplified by NAND, in accordance with aspects of the present disclosure. As shown in FIG. 4, the NAND memory cell array 301 may include a stacked structure 410, which includes a plurality of gate layers 411 and a plurality of insulating layers 412 alternately stacked in sequence, and a channel structure penetrating vertically through the gate layers 411 and the insulating layers 412. The channel structure is coupled with each gate layer to form a memory cell, and the channel structure is coupled with multiple gate layers in the stacked structure 410 to form a string 308. The gate layer 411 and the insulating layer 412 can be stacked alternately, and two adjacent gate layers 411 are separated by an insulating layer 412.

The constituent material of the gate layer 411 may include a conductive material. The conductive material may include but is not limited to tungsten (W), cobalt (Co), Copper (Cu), aluminum (Al), polysilicon, doped silicon, silicide, or any combination thereof. In some examples, each gate layer 411 may include a metal layer, e.g., a tungsten layer. In some examples, each gate layer 411 includes a doped polysilicon layer. Each gate layer 411 may include a control gate surrounding the memory cell. The gate layer 411 at the top of the stacked structure 410 may extend laterally as a top selective gate line, the gate layer 411 at the bottom of the stacked structure 410 may extend laterally as a bottom selective gate line, and the gate layer 411 extending laterally between the top selective gate line and the bottom selective gate line may be used as a word line layer.

In some examples, the stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, the string 308 includes a channel structure extending vertically through the stacked structure 410. In some examples, the channel structure includes a channel hole filled with semiconductor material(s) (e.g., as a semiconductor channel) and dielectric material(s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer May include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 5:
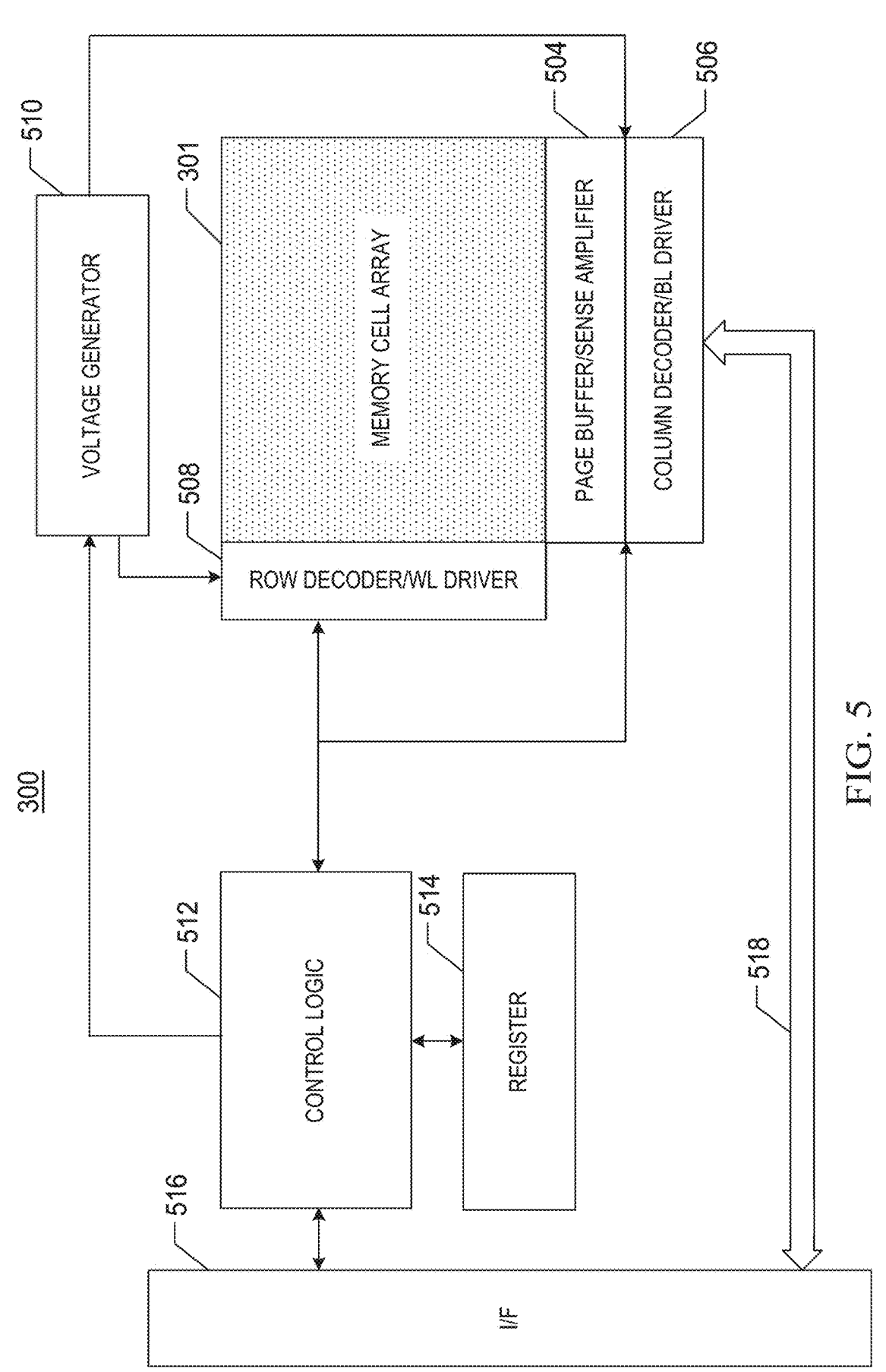
FIG. 5 is a schematic diagram of an example memory device including a memory cell array and peripheral circuits according to an example of the present disclosure.

Referring back to FIG. 3B, peripheral circuits 302 can be coupled to memory cell array 301 through bit lines 316, word lines 318, source lines 314, BSG lines 315, and TSG lines 313. Peripheral circuits 302 can include any suitable analog, digital, and mixed-signal circuits for facilitating the operations of memory cell array 301 by applying and sensing at least one of voltage signals or current signals to and from each target memory cell 306 through bit lines 316, word lines 318, source lines 314, BSG lines 315, and TSG lines 313. Peripheral circuits 302 can include various types of peripheral circuits formed using metal-oxide-semiconductor (MOS) technologies. For example, FIG. 5 illustrates some example peripheral circuits, the peripheral circuits 302 including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store program data (write user data) to be programmed into memory cell array 301. In another example, page buffer/ sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more strings 308 by applying bit line voltages generated from voltage generator 510.

Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some examples, row decoder/word line driver 508 can also select/ deselect and drive BSG lines 315 and TSG lines 313 as well. As described below in detail, row decoder/word line driver 508 is configured to perform program operations on the memory cells 306 coupled to the selected word line(s) 318. Voltage generator 510 can be configured to be controlled by control logic 512 and generate the word line voltages (e.g., read voltage, program voltage, pass voltage, channel boost voltage, verification voltage, etc.), bit line voltages, and source line voltages to be supplied to memory cell array 301.

Control logic 512 may be coupled to each other part of the peripheral circuits described above and configured to control the operation of each other part of the peripheral circuits. Registers 514 can be coupled to control logic 512 and include status registers, command registers, and address registers for storing status information, command operation codes (OP codes), and command addresses for controlling the operations of each peripheral circuit. Interface 516 may be coupled to control logic 512 and act as a control buffer to buffer and relay control commands received from a host (not shown) to control logic 512, and to buffer and relay status information received from control logic 512 to the host. Interface 516 may further be coupled to column decoder/bit line driver 506 via data bus 518 and act as a data I/O interface and data buffer to buffer and relay data to or from memory cell array 301.

For a three-dimensional NAND type memory, a variety of programming methods such as Incremental Step-Pulse Programming (ISPP) may be used to write user data. During a program operation, a redundant array coding operation will be performed on the user data to form check data such as parity check data before being stored in memory cells. In this way, redundant protection (Raid) can be performed on the user data by using the check data when the user data is read. For example, when errors occur in the read user data, error correction and data recovery can be performed on the data errors by using the check data.

The check data can be stored in some memory cells (i.e., check bits) of the memory device, wherein these memory cells are not used to store actual user data but are used to store check data. In addition, the check data can also be stored in a check buffer of a memory controller. In this way, when errors occur in reading certain user data, the error correction and data recovery can be performed on the data errors by using the check data stored in the check bits or the check buffer. In some examples, the check data is calculated using algorithms such as Hamming code and XOR operations. In the examples of the present disclosure, the reading performance can be greatly improved by utilizing the protection function of the check data. It should be noted that the check data described below in this disclosure is stored in some memory cells (check bits) of the memory device.

Here, parity checking for obtaining parity check data is a method of checking the correctness of code transmission, which is based on whether the number of "1"s in digits of a set of binary codes being transmitted is an odd or even number. The use of an odd number is referred to as odd check, and vice versa, known as even check. Which type of check is used is specified in advance. In some examples, a parity check bit is specially set to make the number of "1"s in this set of codes an odd or even number. If odd check is used, when a receiving end receives this set of codes, it will check whether the number of "1"s is an odd number, thereby determining the correctness of code transmission. The data stored in the parity check bits is referred to as parity check data.

It should be noted that redundant protection of user data can also comprise various other methods. Here, only the method of using check data is taken as an example.

Figure 6A:
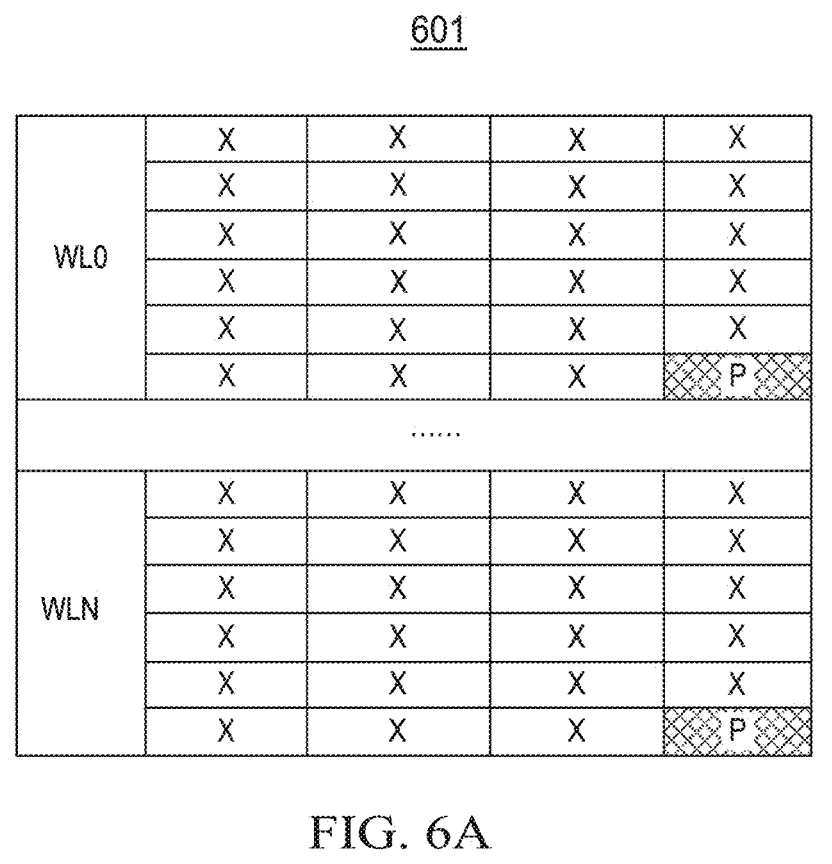

In some examples, during the programming process (the process of writing user data), an XOR operation (the operation symbol is XOR) is performed on the user data located on the same page or on the same string to form the check data, and the check data is stored in the check bit of the corresponding page or corresponding string (typically, the memory cell with the last number). It should be understood that, the error correction or data recovery can only be performed on data error in the corresponding memory cell by using the check data, and the error correction or data recovery can only be performed on one data error by using one check data. As an example, referring to FIG. 6A, which shows a schematic structural diagram of memory cells in which one page corresponds to one check data, wherein the memory system includes one or more memory devices, each memory device includes one or more dies 601, and each die 601 includes multiple word lines (WL0 to WLN); user data (X) in the multiple memory cells coupled to the same word line WL corresponds to one check data (P). When a data error occurs in the multiple memory cells coupled to a word line, the error correction or data recovery can be performed on the data error by using the check data corresponding to that word line. However, when two or more data errors occur in the multiple memory cells coupled to the same word line, the error correction or data recovery cannot be performed on the two or more data errors by using the check data corresponding to that word line.

Based on this, the examples of the present disclosure further provide a method for setting check data, for example, making the multiple memory cells coupled to the same word line correspond to multiple check data respectively. For example, referring to FIG. 6B, which shows a schematic structural diagram of memory cells in which one page corresponds to multiple check data, wherein the memory device includes one or more dies 602, each die 602 includes multiple word lines (WL0 to WLN), each word line is coupled to 6 strings (Str0, Str1, Str2, Str3, Str4, Str5), each string includes 4 memory cells (Cell1, Cell2, Cell3, Cell4), some memory cells (Cell1, Cell2, Cell3) of each string are used to store user data (X1, X2, X3), and a check bit (Cell4) is used to store check data (P0). The check data (P0) is obtained by XORing all user data User data (X1, X2, X3) in one string. Therefore, when a data error occurs in multiple memory cells coupled to one string, the error correction or data recovery can be performed on the data error by using the corresponding check data (P0). In other words, when two or more data errors occur in user data in multiple memory cells coupled to the same word line, if the two or more data errors are stored in different strings respectively, the error correction or data recovery can be performed on the corresponding data error by using two or more check data corresponding to the respective strings. However, as shown in FIG. 6B, each string corresponds to one check data, so that the check data coupled to the same word line occupies a large storage space, resulting in a waste of storage resources.

To this end, the examples of the present disclosure provide another method for setting check data, wherein the memory device comprises: one or more dies, and each of the dies comprises a plurality of word lines, a plurality of strings coupled to each of the word lines are divided into a first string area and a second string area; and at least one redundant stripe corresponding to each of the word lines, wherein the redundant stripe comprises a first redundant stripe which is configured to store first check data, wherein the first check data is obtained by performing error correction coding on data in a first string area of a word line where the first redundant stripe is located and data in a second string area of a word line adjacent to the word line where the first redundant stripe is located; and a memory controller coupled to the memory device and configured to: when a plurality of data errors occur in a plurality of strings coupled to one of the word lines, perform correction by using the first check data stored in a redundant stripe corresponding to a corresponding word line and the first check data stored in a redundant stripe corresponding to a word line adjacent to the corresponding word line.

In some examples, the redundant stripe further comprises a second redundant stripe which is configured to store second check data, wherein the second check data is obtained by performing error correction coding on data in a first string area or data in a second string area of a word line where the second redundant stripe is located; and the memory controller is further configured to: when a plurality of data errors occur in a plurality of strings coupled to one of the word lines: perform correction by using the second check data stored in a redundant stripe corresponding to a corresponding word line and the first check data stored in a redundant stripe corresponding to a word line adjacent to the corresponding word line; or perform correction by using the first check data and the second check data stored in a redundant stripe corresponding to a corresponding word line.

Figure 7:
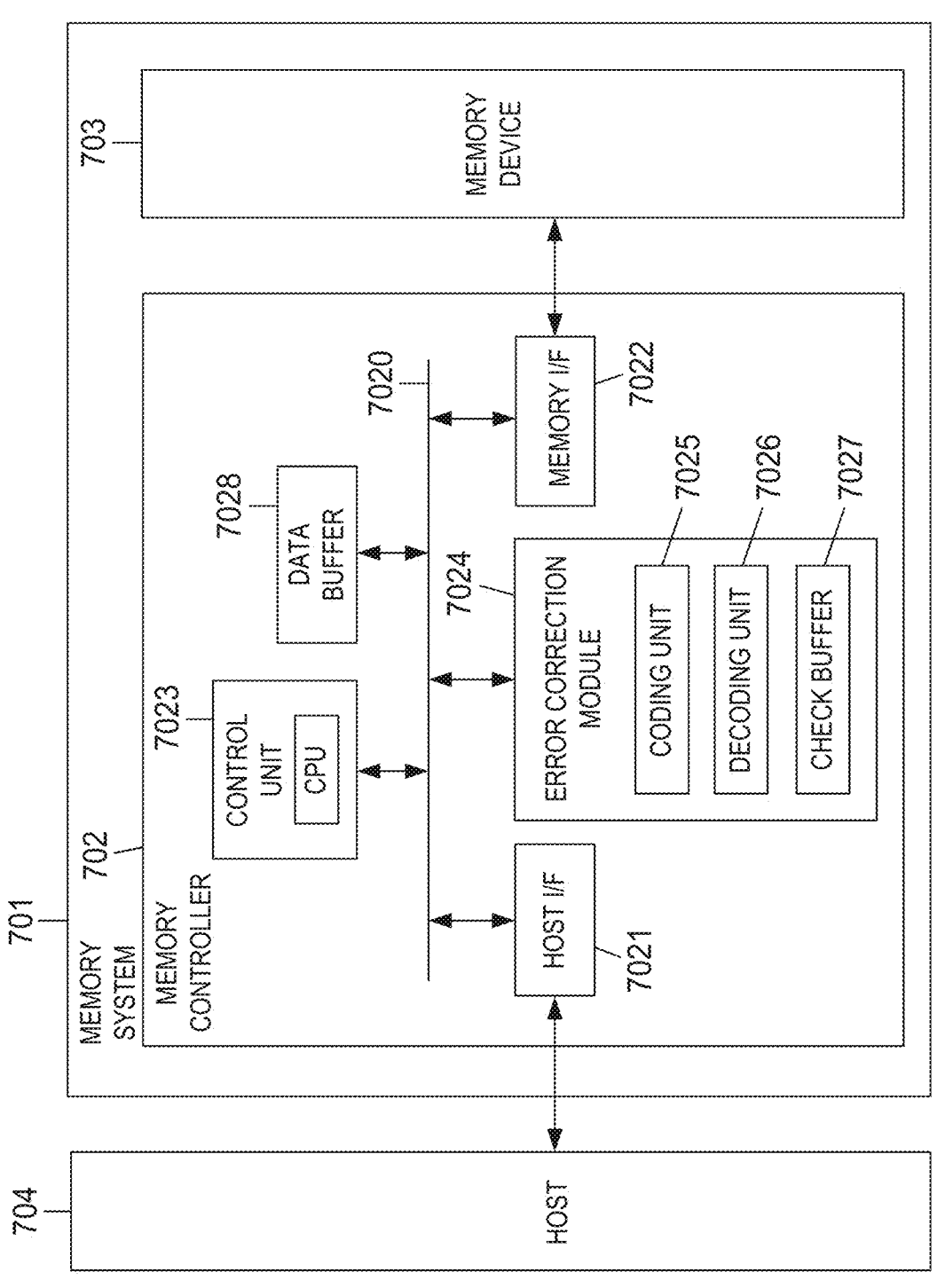
FIG. 7 is a constitutive block diagram of a memory system according to an example of the present disclosure.

Referring to FIG. 7, a constitutive block diagram of a memory system is shown. The memory system 701 includes: a memory controller 702 and a memory device 703. The memory controller 702 is configured to control the memory device 703 to perform operations such as read, write, and erase operations. Here, the memory controller 702 and the memory device 703 may be coupled in any suitable manner. In the examples of the present disclosure, the memory device 703 may be a semiconductor memory that stores data in a non-volatile manner, such as a NAND type memory. The memory system 701 is connected to a host 704, which may be an electronic device such as a personal computer or a mobile terminal. The host I/F 7021 outputs commands, user data (written data) and the like received from the host 704 to the internal bus 7020, and transmits user data read from the memory device 703, responses from the control unit 7023 and the like to the host 704.

The memory I/F 7022 controls the process of writing user data and the like to the memory device 703 and the process of reading from the memory device 703 based on instructions from the control unit 7023. The control unit 7023 controls the memory system 701 as a whole. The control unit 7023 is, for example, a central processing unit (CPU), a microprocessor (MPU), or the like. When receiving a command from the host 704 via the host I/F 7021, the control unit 7023 performs control based on the command. For example, the control unit 7023 instructs the memory I/F 7022 to write user data and parity check data into the memory device 703 based on a command from the host 704. In addition, the control unit 7023 instructs the memory I/F 7022 to read user data and parity check data from the memory device 703 based on a command from the host 704.

The error correction (ECC) module 7024 includes a coding unit 7025, a decoding unit 7026, and a check buffer 7027. The coding unit 7025 codes user data of a predetermined size written on the same page to generate parity check data. The parity check data is written in the page where the user data that is the basis for coding has been written, and the decoding unit 7026 performs decoding using the parity check data. The check buffer 7027 may be configured to store parity check data.

The data buffer 7028 temporarily stores user data received from the host 704 before storing the user data in the memory device 703, and temporarily stores data read from the memory device 703 before sending the data to the host 704.

As mentioned above, the memory device may include one or more dies, each die may include multiple blocks, each block may include multiple strings (Str), and each string may include multiple memory cells. In addition, each die may also include multiple word lines (WL), and each word line (WL) is coupled to multiple memory cells. In other words, one word line can be coupled to memory cells in multiple strings. Here, multiple strings coupled to the same word line can be located in the same block or in different blocks.

In this example of the present disclosure, multiple strings coupled to each word line are divided into two areas, a first string area and a second string area, wherein the first string area and the second string area may be located in the same block, or located in different blocks respectively. Furthermore, the number of strings in the first string area and the number of strings in the second string area may be the same or different.

In some examples, each die includes (N+1) word lines, each word line is coupled to M strings, and each string includes L memory cells. M strings coupled to the same word line are divided into a first string area and a second string area. The number of strings in each string area is the same, that is, M/2.

Figure 8:
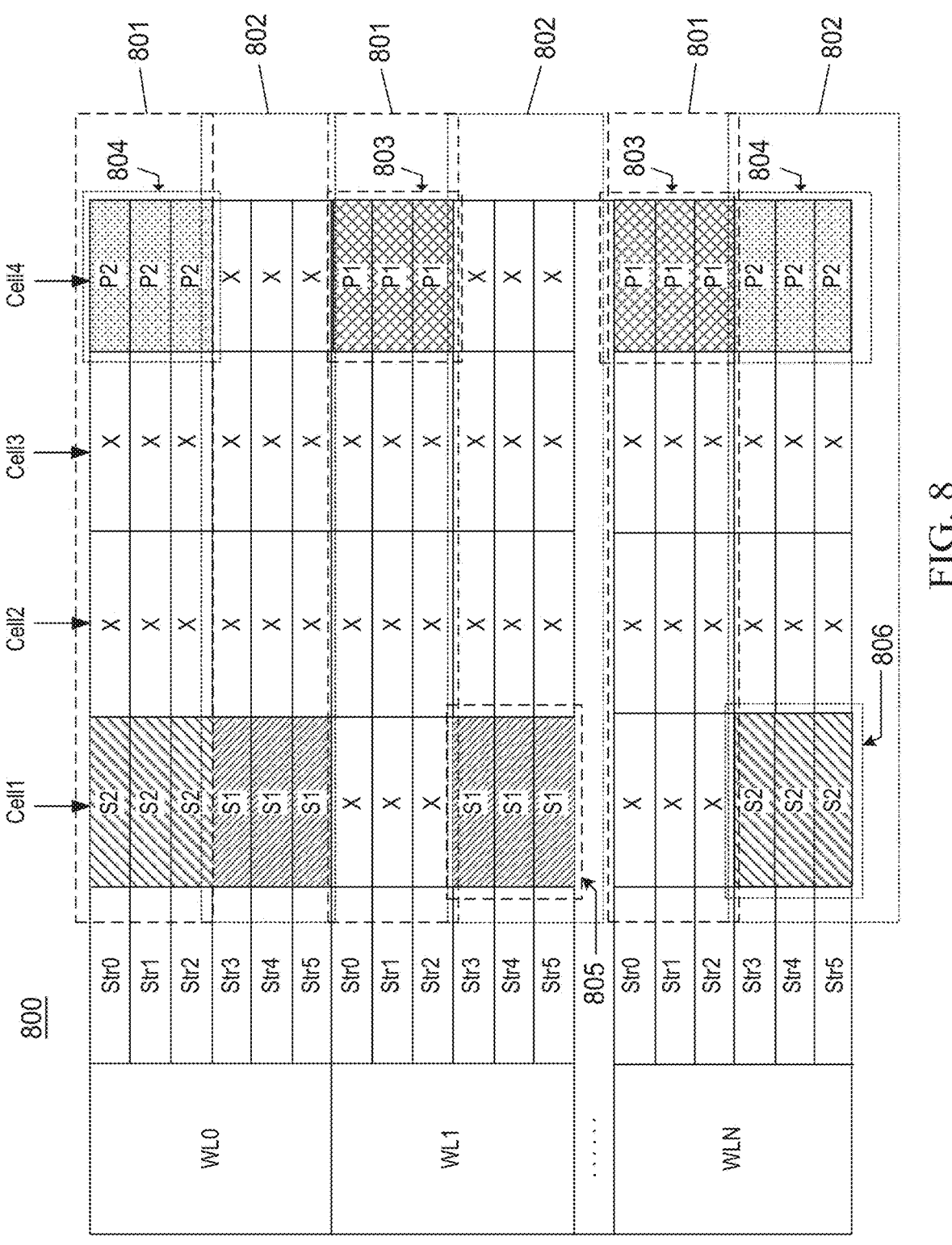
FIG. 8 is a schematic diagram of the layout structure of user data and check data in multiple word lines according to an example of the present disclosure.

As an example, referring to FIG. 8, the memory device includes a plurality of dies 800, and each die 800 includes (N+1) word lines. Here, the (N+1) word lines are numbered from a 0th word line to an Nth word line according to physical positions, for example, a 0th word line WL0, a 1st word line WL1 to a Nth word line WLN. Each word line is coupled to 6 strings, which are arranged in the order from the 0th string to the 5th string, such as the 0th string Str0, the first string Str1, the second string Str2, the third string Str3, the fourth string Str4, and the fifth string Str5. Each string includes 4 memory cells, which are arranged in the order of the first memory cell to the fourth memory cell, such as the first memory cell Cell1, the second memory cell Cell2, the third memory cell Cell3, and the fourth memory cell Cell4. It should be noted that FIG. 8 only illustrates that each die includes 6 strings and each string includes 4 memory cells (i.e., M=6, L=4). However, it should be understood that, each die may include more strings, such as 12, 24, 32 strings, etc., and each string may include more memory cells, such as 32, 64, 128 memory cells, etc.

In this example of the disclosure, the six strings coupled to each word line are divided into a first string area 801 and a second string area 802. The numbers of the strings in the first string area 801 and the second string area 802 are the same, and both are 3. The first string area 801 includes the 0th string Str0, the first string Str1, and the second string Str2, and the second string area 802 includes the third string Str3, the fourth string Str4, and the fifth string Str5.

The four memory cells in each string can all be used to store user data, or used to store user data and check data (P1 or P2) respectively. Here, the user data can be divided into start data (S1 or S2) and non-start data (X), wherein the start data (S1 or S2) is stored in the first memory cell of the string. In addition, one check data can correspond to user data in one string or correspond to user data in multiple strings.

In the examples of the present disclosure, each word line corresponds to at least one redundant stripe, and the redundant stripe is used to store check data. Depending on different types of stored check data, the redundant stripe may include a first redundant stripe and a second redundant stripe, wherein the first redundant stripe is used to store first check data, and the second redundant stripe is used to store second check data. The first redundant stripe may include a plurality of memory cells, and each of the plurality of memory cells is used to store one first check data. The second redundant stripe may also include a plurality of memory cells, and each of the plurality of memory cells is used to store one second check data. Here, the number of first check data and the number of second check data are related to the number of strings in the corresponding string area.

The first check data is obtained by performing error correction coding on data in a first string area of a word line where the first redundant stripe is located and data in a second string area of a word line adjacent to the word line where the first redundant stripe is located. In some examples, one first check data in the first redundant stripe is obtained by performing error correction coding on the user data stored in one string in the first string area of the word line where the first redundant stripe is located and user data stored in one string in the second string area of the word line adjacent to the word line where the first redundant stripe is located. It is understood that one first check data corresponds to user data stored in two strings. In other words, error correction coding (such as XOR operation) is performed on the user data stored in the two strings coupled to the two word lines respectively to obtain one first check data. Here, the number of first check data is related to the number of strings in the first string area of the word line where the first redundant stripe is located, and the number of strings in the second string area of the word line adjacent to the word line where the first redundant stripe is located.

Similarly, the second check data is obtained by performing error correction coding on data in a first string area or data in a second string area of a word line where the second redundant stripe is located. In some examples, one second check data is obtained by performing error correction coding on the user data stored in one string in the first string area of the word line where the second redundant stripe is located. Alternatively, one second check data is obtained by performing error correction coding on the user data stored in one string in the second string area of the word line where the second redundancy stripe is located. It is understood that one second check data corresponds to user data stored in one string. In other words, error correction coding (such as XOR operation) is performed on the user data stored in one string to obtain one second check data. Here, the number of the second check data is related to the number of strings in the first string area of the word line where the second redundant stripe is located, or the number of strings in the second string area of the word line where the second redundant stripe is located.

In some examples, the die includes a first redundant stripe and a second redundant stripe, wherein a plurality of first check data coupled to the same word line constitute a first redundant stripe, and a plurality of second check data coupled to the same word line constitute a second redundant stripe.

The 0th word line corresponds to one second redundant stripe, and the second check data is obtained by performing error correction coding on data in a first string area of the 0th word line.

Each of the 1st to (N−1)th word lines corresponds to one first redundant stripe, and each of the first check data is obtained by performing error correction coding on data in a first string area of a corresponding word line and data in a second string area of a preceding word line of the corresponding word line.

The Nth word line corresponds to one first redundant stripe and one second redundant stripe, the first check data is obtained by performing error correction coding on data in a first string area of the Nth word line and data in a second string area of the (N−1)th word line, and the second check data is obtained by performing error correction coding on data in a second string area of the Nth word line.

As an example, referring to FIG. 8, the die 800 shown in FIG. 8 includes a plurality of first redundant stripes 803 and a plurality of second redundant stripes 804. The multiple memory cells used to store the first check data and coupled to the same word line constitute a first redundant stripe 803. As shown in FIG. 8, each of the first redundant stripe 803 includes three fourth memory cells Cell4, and each of the fourth memory cells is used to store one first check data P1. Here, one first check data P1 in the first redundant stripe 803 corresponding to the first word line WL1 is obtained by performing common error correction coding on the user data in one string in the first string area 801 (Str0, Str1, Str2) coupled to the first word line WL1 and the user data in one string in the second string area 802 (Str3, Str4, Str5) in the 0th word line WL0.

It should be noted that the string corresponding to the first check data P1 can be any string in the corresponding string area. For a clearer understanding, the correspondence between the check data and the strings are all corresponded in the order of numbering.

As an example, the first one of the first check data P1 in the first redundant stripe 803 corresponding to the first word line WL1 is obtained by performing common error correction coding on the user data in the 0th string Str0 in the first string area 801 coupled to the first word line WL1 and the user data in the third string Str3 in the second string area 802 in the 0th word line WL0.

As an example, the second one of the first check data P1 in the first redundant stripe 803 corresponding to the first word line WL1 is obtained by performing common error correction coding on the user data in the first string Str1 in the first string area 801 coupled to the first word line WL1 and the user data in the fourth string Str4 in the second string area 802 in the 0th word line WL0. Each of the first check data corresponds to user data in two strings coupled to two word lines respectively according to the numbering sequence.

In the die 800, the first check data in the first redundant stripe corresponding to the Nth word line is obtained by performing error correction coding on the data in the first string area of the Nth word line and the data in the second string area of the (N−1)th word line. The corresponding manner is the same as the above examples and will not be described again.

It should be noted that one second check data is obtained by performing error correction coding on the data of each string in the first string area of the 0th word line and the second string area of the Nth word line. A plurality of memory cells coupled to the same word line for storing second check data constitute one second redundant stripe.

Referring to FIG. 8, each of the second redundant stripe 804 includes three fourth memory cells Cell4, and each of the fourth memory cells is used to store one second check data P2. Each of the second check data P2 is obtained by performing error correction coding on the user data in one string in the first string area or the user data in one string in the second string area of the word line where the second redundant stripe is located.

In some examples, one second check data P2 in the second redundant stripe 804 corresponding to the 0th word line WL0 is obtained by performing error correction coding on the user data in one string of the first string area 801 coupled to the 0th word line WL0. Alternatively, one second check data P2 in the second redundant stripe 804 corresponding to the Nth word line WLN is obtained by performing error correction coding on the user data in one string in the second string area 802 coupled to the Nth word line WLN.

As an example, the first one of the second check data P2 in the second redundant stripe 804 corresponding to the 0th word line WL0 is obtained by performing error correction coding on the user data in the 0th string Str0 in the first string area 801 coupled to the 0th word line WL0. The second one of the second check data P2 in the second redundant stripe 804 corresponding to the 0th word line WL0 is obtained by performing error correction coding on the user data in the 1st string Str1 in the first string area 801 coupled to the 0th word line WL0.

As an example, the first one of the second check data P2 in the second redundant stripe 804 corresponding to the Nth word line WLN is obtained by performing error correction coding on the user data in the third string Str3 in the second string area 802 coupled to the Nth word line WLN. The second one of the second check data P2 in the second redundancy stripe 804 corresponding to the Nth word line WLN is obtained by performing error correction coding on the user data in the fourth string Str4 in the second string area 802 coupled to the Nth word line WLN. Each of the second check data corresponds to user data in one string coupled to the same word line according to the numbering sequence.

In some examples, a ratio of the number of memory cells occupied by the redundant stripe in each die to the number of all memory cells in the die is: $(N+2)(M/2)/(N+1)*M*L$.

In this way, compared to each string corresponding to one check data, that is, the ratio of the number of memory cells occupied by the redundant stripe in each die to the number of all memory cells in the die is: $(N+1)*M*1/(N+1)*M*L=1/L$, it is possible to save the storage space occupied by the check data while ensuring that, when two errors occur in multiple string areas coupled to the same word line, the two errors can be error corrected by using the check data in the different redundant stripes corresponding to the two word lines. In other words, the error correction capability can be improved, the reliability of the memory device can be enhanced while reducing the amount of check data and the storage space it occupies to improve the utilization of memory resources.

In some examples, the 0th word line corresponds to a set of first start data and a set of second start data, wherein the first start data comprises data stored in a first memory cell of each string in a second string area of the 0th word line, and the second start data comprises data stored in a first memory cell of each string in the first string area of the 0th word line; each of the 1st to (N−1)th word line corresponds to a set of the first start data, wherein each set of the first start data comprises data stored in a first memory cell of each string in a second string area of a corresponding word line; and the Nth word line corresponds to a set of the second start data, wherein the second start data comprises data stored in a first memory cell of each string in the second string area of the Nth word line.

As an example, referring to FIG. 8, the die 800 includes multiple sets of first start data 805 and multiple sets of second start data 806, wherein one set of first start data 805 includes 3 first start data S1, each of the first start data S1 corresponds to the first check data P1 corresponding to the string in which it is located. Each of the first start data S1 is the first user data among all user data for use in performing error correction coding (such as XOR operation) to obtain the first check data P1. Here, a set of second start data 806 includes three second start data S2, and each of the second start data S2 corresponds to the second check data P2 corresponding to the string in which it is located. Each of the second start data S2 is the first user data among all user data for use in performing error correction coding (such as XOR operation) to obtain the second check data P2.

It should be noted that in order to distinguish the start data and non-start data in the user data, the first start data is represented by "S1" in FIG. 8, the second start data is represented by "S2", and the non-start data is represented by "X".

In some examples, when the die only includes two word lines, that is, the die comprises a 0th word line and a 1st word line numbered according to physical locations, the 0th word line corresponds to one second redundant stripe, and the second check data is obtained by performing error correction coding on data in a first string area of the 0th word line; and the 1st word line corresponds to one first redundant stripe and one second redundant stripe, the first check data is obtained by performing error correction coding on data in a first string area of the 1st word line and data in a second string area of the 0th word line, and the second check data is obtained by performing error correction coding on data in a second string area of the 1st word line.

Figure 9:
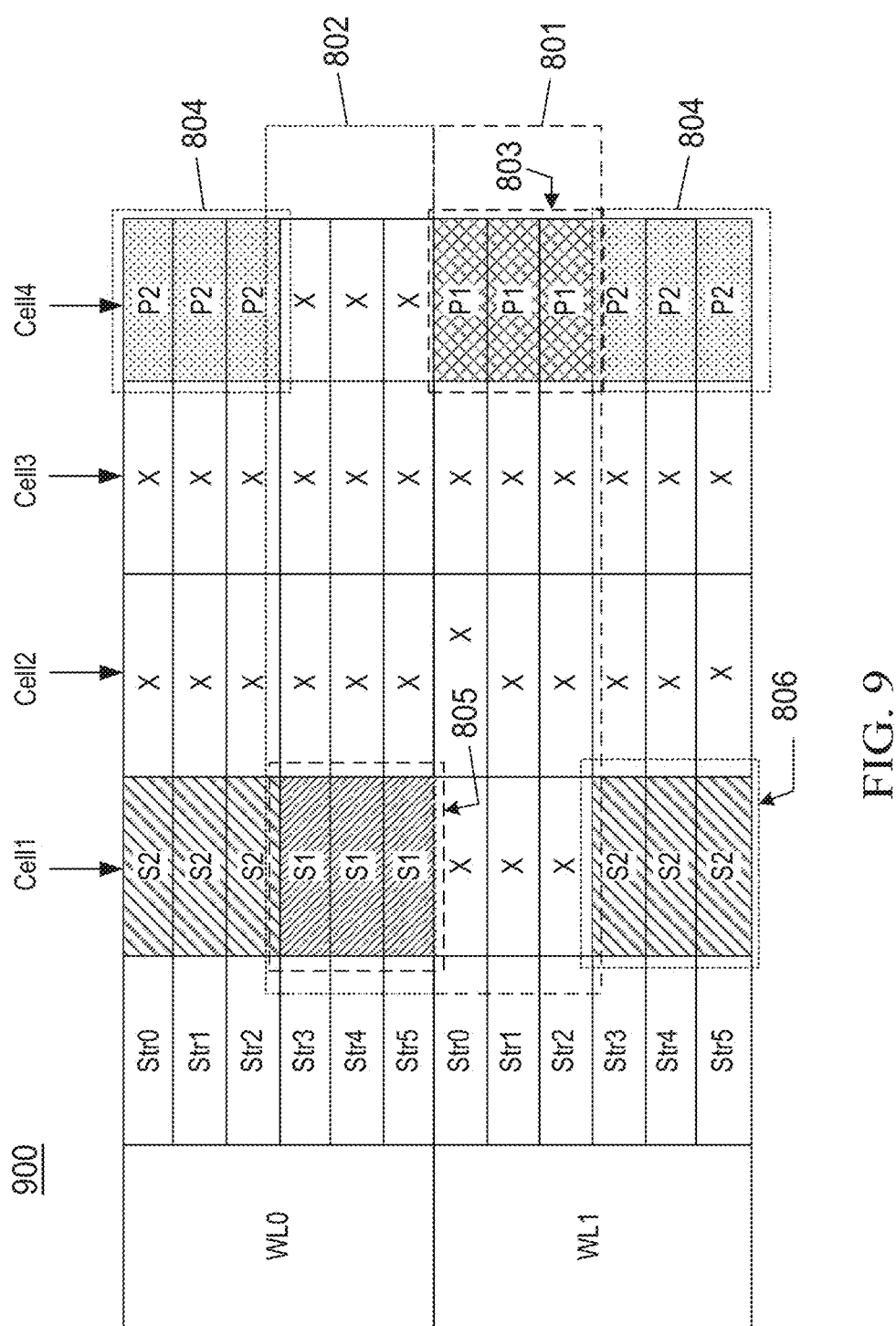
FIG. 9 is a schematic diagram of the layout structure of user data and check data in two word lines according to an example of the present disclosure.

As an example, referring to FIG. 9, the die 900 includes a 0th word line WL0 and a 1st word line WL1, wherein the 0th word line WL0 corresponds to one second redundant stripe 804, and the second redundant stripe 804 includes three second check data P2. The first one of the second check data P2 is obtained by performing error correction coding on the user data stored in the 0th string Str0 in the first string area of the 0th word line WL0. The second one of the second check data P2 is obtained by performing error correction coding on the user data stored in the first string Str1 in the first string area of the 0th word line WL0. The third one of the second check data P2 is obtained by performing error correction coding on the user data stored in the second string Str2 in the first string area of the 0th word line WL0.

The first word line WL1 corresponds to one first redundant stripe 803 and one second redundant stripe 804. Each of the first redundant stripe 803 includes three first check data P1, and each second redundant stripe 804 includes three second check data P2. For example, the first one of the first check data P1 is obtained by performing common error correction coding on the data stored in the 0th string Str0 in the first string area 801 of the 1st word line WL1 and the data stored in the third string Str3 in the second string area 802 of the 0th word line WL0, and so on. By way of example, the first one of the second check data P2 is obtained by performing error correction coding on the data stored in the third string Str3 in the second string area 802 of the 1st word line WL1, and so on.

Based on this, in the examples of the present disclosure, multiple strings coupled to each word line are divided into a first string area and a second string area. The first string area coupled to the first word line among the multiple word lines corresponds to one second redundant stripe, the second string area coupled to the first word line and the first string area coupled to the second word line correspond to one first redundant stripe, and the second string area coupled to the second word line and the first string area coupled to the third word line correspond to one first redundant stripe. Similarly, the first string area coupled to the last word line among the plurality of word lines and the second string area coupled to the preceding word line of the last word line correspond to one first redundant stripe, and the second string area coupled to the last word line corresponds to one second redundant stripe. In this case, two string areas, each of which is coupled to each of two word lines among all the word lines located between the first word line and the last word line, jointly correspond to one first redundant stripe, and the remaining string areas among the string areas coupled to the first word line and the last word line correspond to one second redundant stripe, respectively. In this way, on the one hand, when an error occurs in each of the two string areas coupled to the same word line, the two first check data corresponding to the same word line may be utilized to correct the two errors to improve the error correction capability and enhance the reliability of the memory device. On the other hand, the two string areas coupled to the two word lines respectively correspond to one first redundant stripe, which reduces the number and occupied space of first redundant stripes, which improves the utilization of memory resources.

On the basis of the above memory system, the examples of the present disclosure further provide a memory device, comprising:

a die comprising a plurality of word lines, wherein a plurality of strings coupled to each of the word lines are divided into a first string area and a second string area; and at least one redundant stripe corresponding to each of the word lines, wherein the redundant stripe comprises a first redundant stripe which is configured to store first check data, wherein the first check data is obtained by performing error correction coding on data in a first string area of a word line where the first redundant stripe is located and data in a second string area of a word line adjacent to the word line where the first redundant stripe is located.

In some examples, the redundant stripe further comprises a second redundant stripe which is configured to store second check data, wherein the second check data is obtained by performing error correction coding on data in a first string area or data in a second string area of a word line where the second redundant stripe is located.

In some examples, the die comprises a 0th word line to an Nth word line numbered according to physical locations, and the die is sequentially programmed from the 0th word line to the Nth word line, wherein the N is an integer greater than 1; the 0th word line corresponds to one second redundant stripe, and the second check data is obtained by performing error correction coding on data in a first string area of the 0th word line; each of the 1st to (N−1)th word lines corresponds to one first redundant stripe, and each of the first check data is obtained by performing error correction coding on data in a first string area of a corresponding word line and data in a second string area of a preceding word line of the corresponding word line; and the Nth word line corresponds to one first redundant stripe and one second redundant stripe, the first check data is obtained by performing error correction coding on data in a first string area of the Nth word line and data in a second string area of the (N−1)th word line, and the second check data is obtained by performing error correction coding on data in a second string area of the Nth word line.

In some examples, the 0th word line corresponds to a set of first start data and a set of second start data, wherein the first start data comprises data stored in a first memory cell of each string in a second string area of the 0th word line, and the second start data comprises data stored in a first memory cell of each string in the first string area of the 0th word line; each of the 1st to (N−1)th word line corresponds to a set of the first start data, wherein each set of the first start data comprises data stored in a first memory cell of each string in a second string area of a corresponding word line; and the Nth word line corresponds to a set of the second start data, wherein the second start data comprises data stored in a first memory cell of each string in the second string area of the Nth word line.

In some examples, the die comprises a 0th word line and a 1st word line numbered according to physical locations; the 0th word line corresponds to one second redundant stripe, and the second check data is obtained by performing error correction coding on data in a first string area of the 0th word line; and the 1st word line corresponds to one first redundant stripe and one second redundant stripe, the first check data is obtained by performing error correction coding on data in a first string area of the 1st word line and data in a second string area of the 0th word line, and the second check data is obtained by performing error correction coding on data in a second string area of the 1st word line.

In some examples, the number of strings in the first string area is the same as the number of strings in the second string area.

In some examples, each die comprises (N+1) word lines, each of the word lines is coupled to M strings, and each of the strings comprises L memory cells, and wherein a ratio of the number of memory cells occupied by the redundant stripe in each die to the number of all memory cells in the die is: $(N+2)\ (M/2)/(N+1)*M*L$.

In some examples, the first string area and the second string area coupled to each of the word lines are located in a same block; or the first string area and the second string area coupled to each of the word lines are located in different blocks respectively.

Based on the above memory system, the examples of the present disclosure further provide an operation method of a memory system, the memory system comprises a memory device comprising: a die comprising a plurality of word lines, wherein a plurality of strings coupled to each of the word lines are divided into a first string area and a second string area; and at least one redundant stripe corresponding to each of the word lines, wherein the redundant stripe comprises a first redundant stripe which is configured to store first check data, wherein the first check data is obtained by performing error correction coding on data in a first string area of a word line where the first redundant stripe is located and data in a second string area of a word line adjacent to the word line where the first redundant stripe is located; and a memory controller coupled to the memory device, and wherein the operation method comprises: when a plurality of data errors occur in a plurality of strings coupled to one of the word lines, performing correction by using the first check data stored in a redundant stripe corresponding to a corresponding word line and the first check data stored in a redundant stripe corresponding to a word line adjacent to the corresponding word line.

In some examples, the redundant stripe further comprises a second redundant stripe which is configured to store second check data, wherein the second check data is obtained by performing error correction coding on data in a first string area or data in a second string area of a word line where the second redundant stripe is located; and the operation method comprises: when a plurality of data errors occur in a plurality of strings coupled to one of the word lines: performing correction by using the second check data stored in a redundant stripe corresponding to a corresponding word line and the first check data stored in a redundant stripe corresponding to a word line adjacent to the corresponding word line; or performing correction by using the first check data and the second check data stored in a redundant stripe corresponding to a corresponding word line.

An example of the present disclosure also provides a storage medium storing thereon executable instructions that, when executed by a memory controller, can implement operations of the method described in the above examples of the present disclosure.

In some examples, the storage medium may be memories such as Ferromagnetic Random Access Memory (FRAM), Read Only Memory (ROM), or Programmable Read-Only Memory (PROM), Erasable Programmable Read-Only Memory (EPROM), Electrically Erasable Programmable Read-Only Memory (EEPROM), Flash Memory, magnetic surface memory, optical disc, or Compact Disc Read-Only Memory (CD-ROM); alternatively, it may be various devices including one of the above memory devices or any combination thereof.

In some examples, executable instructions may in the form of a program, software, software module, script, or code, written in any form of programming language, including compiled or interpreted languages, or declarative or procedural languages, and may be deployed in any form, including deployed as a stand-alone program or deployed as a module, component, subroutine, or other means suitable for use in a computing environment.

As an example, executable instructions may, but do not necessarily, correspond to files in a file system and may be stored as part of a file holding other programs or data, for example, stored in one or more scripts in a Hyper Text Markup Language (HTML) document, stored in a single file that is specific to the program in question, or, stored in multiple collaborative files (for example, a file that stores one or more modules, subroutines, or portions of code).

It should be noted that "first", "second", and the like are used to distinguish similar objects and are not used to describe a specific order or sequence. In addition, the technical solutions described in the examples of the present disclosure may be combined arbitrarily as long as there is no conflict.

The above descriptions are only examples of the present disclosure and are not intended to limit the scope of the present disclosure.

What is claimed is:

1. A memory device, comprising:
a plurality of word lines, wherein a plurality of strings coupled to each of the word lines are divided into a first string area and a second string area, wherein the first string area and the second string area coupled to each of the word lines are located in different blocks, respectively; and
at least one redundant stripe corresponding to each of the word lines, wherein the redundant stripe comprises a first redundant stripe which is configured to store first check data, wherein the first check data is obtainable by performing error correction coding on data in a first string area of a word line where the first redundant stripe is located and data in a second string area of a word line adjacent to the word line where the first redundant stripe is located.

2. The memory device according to claim 1, wherein the redundant stripe further comprises a second redundant stripe which is configured to store second check data, wherein the second check data is obtainable by performing error correction coding on one of data in a first string area or data in a second string area of a word line where the second redundant stripe is located.

3. The memory device according to claim 2, comprising a 0th word line to an Nth word line numbered according to physical locations, wherein the memory device is sequentially programmed from the 0th word line to the Nth word line, and wherein N is an integer greater than 1;
the 0th word line corresponds to one second redundant stripe, and the second check data is obtainable by performing error correction coding on data in a first string area of the 0th word line;
each of the 1st to (N−1)th word lines corresponds to one first redundant stripe, and each of the first check data is obtainable by performing error correction coding on data in a first string area of a corresponding word line and data in a second string area of a preceding word line of the corresponding word line; and
the Nth word line corresponds to one first redundant stripe and one second redundant stripe, the first check data is obtainable by performing error correction coding on data in a first string area of the Nth word line and data in a second string area of the (N−1)th word line, and the second check data is obtainable by performing error correction coding on data in a second string area of the Nth word line.

4. The memory device according to claim 3, wherein the 0th word line corresponds to a set of first start data and a set of second start data, wherein the first start data comprises data stored in a first memory cell of each string in a second string area of the 0th word line, and the second start data comprises data stored in a first memory cell of each string in the first string area of the 0th word line;
each of the 1st to (N−1)th word lines corresponds to a set of the first start data, wherein each set of the first start data comprises data stored in a first memory cell of each string in a second string area of a corresponding word line; and the Nth word line corresponds to a set of the second start data, wherein the second start data comprises data stored in a first memory cell of each string in the second string area of the Nth word line.

5. The memory device according to claim 2, comprising a 0th word line and a 1st word line numbered according to physical locations;

the 0th word line corresponds to one second redundant stripe, and the second check data is obtainable by performing error correction coding on data in a first string area of the 0th word line; and the 1st word line corresponds to one first redundant stripe and one second redundant stripe, the first check data is obtainable by performing error correction coding on data in a first string area of the 1st word line and data in a second string area of the 0th word line, and the second check data is obtainable by performing error correction coding on data in a second string area of the 1st word line.

6. The memory device according to claim 1, wherein the number of strings in the first string area is the same as the number of strings in the second string area.

7. The memory device according to claim 6, comprising (N+1) word lines, each of the word lines is coupled to M strings, and each of the strings comprises L memory cells, and wherein a ratio of the number of memory cells occupied by the redundant stripe to the number of memory cells is:

$$(N + 2)(M/2)/(N + 1) * M * L.$$

8. The memory device according to claim 1, wherein the first string area and the second string area coupled to each of the word lines are located in a same block.

9. A memory system, comprising:

a memory device comprising:

a plurality of word lines, wherein a plurality of strings coupled to each of the word lines are divided into a first string area and a second string area, wherein the first string area and the second string area coupled to each of the word lines are located in different blocks, respectively; and at least one redundant stripe corresponding to each of the word lines, wherein the redundant stripe comprises a first redundant stripe which is configured to store first check data, wherein the first check data is obtainable by performing error correction coding on data in a first string area of a word line where the first redundant stripe is located and data in a second string area of a word line adjacent to the word line where the first redundant stripe is located; and a memory controller coupled to the memory device and configured to:

when a plurality of data errors occur in a plurality of strings coupled to one of the word lines, perform correction by using the first check data stored in a redundant stripe corresponding to a corresponding word line and the first check data stored in a redundant stripe corresponding to a word line adjacent to the corresponding word line.

10. The memory system according to claim 9, wherein the redundant stripe further comprises a second redundant stripe which is configured to store second check data, wherein the second check data is obtainable by performing error correction coding on one of data in a first string area or data in a second string area of a word line where the second redundant stripe is located; and the memory controller is further configured to:

when a plurality of data errors occur in a plurality of strings coupled to one of the word lines, perform correction by using the second check data stored in a redundant stripe corresponding to a corresponding word line and the first check data stored in a redundant stripe corresponding to a word line adjacent to the corresponding word line, and perform correction by using the first check data and the second check data stored in a redundant stripe corresponding to a corresponding word line.

11. The memory system according to claim 10, comprising a 0th word line to an Nth word line numbered according to physical locations, wherein the memory system is sequentially programmed from the 0th word line to the Nth word line, and wherein the N is an integer greater than 1;

the 0th word line corresponds to one second redundant stripe, and the second check data is obtainable by performing error correction coding on data in a first string area of the 0th word line;

each of the 1st to (N−1)th word lines corresponds to one first redundant stripe, and each of the first check data is obtainable by performing error correction coding on data in a first string area of a corresponding word line and data in a second string area of a preceding word line of the corresponding word line; and the Nth word line corresponds to one first redundant stripe and one second redundant stripe, the first check data is obtainable by performing error correction coding on data in a first string area of the Nth word line and data in a second string area of the (N−1)th word line, and the second check data is obtainable by performing error correction coding on data in a second string area of the Nth word line.

12. The memory system according to claim 11, wherein the 0th word line corresponds to a set of first start data and a set of second start data, wherein the first start data comprises data stored in a first memory cell of each string in a second string area of the 0th word line, and the second start data comprises data stored in a first memory cell of each string in the first string area of the 0th word line;

each of the 1st to (N−1)th word lines corresponds to a set of the first start data, wherein each set of the first start data comprises data stored in a first memory cell of each string in a second string area of a corresponding word line; and the Nth word line corresponds to a set of the second start data, wherein the second start data comprises data stored in a first memory cell of each string in the second string area of the Nth word line.

13. The memory system according to claim 10, comprising a 0th word line and a 1st word line numbered according to physical locations;

the 0th word line corresponds to one second redundant stripe, and the second check data is obtainable by performing error correction coding on data in a first string area of the 0th word line; and the 1st word line corresponds to one first redundant stripe and one second redundant stripe, the first check data is obtainable by performing error correction coding on data in a first string area of the 1st word line and data in a second string area of the 0th word line, and the second check data is obtainable by performing error correction coding on data in a second string area of the 1st word line.

14. The memory system according to claim 9, wherein the number of strings in the first string area is the same as the number of strings in the second string area.

15. The memory system according to claim 14, comprising (N+1) word lines, each of the word lines is coupled to M strings, and each of the strings comprises L memory cells, and wherein a ratio of the number of memory cells occupied by the redundant stripe to the number of memory cells is:

$$(N+2)(M/2)/(N+1)*M*L.$$

16. An operation method of a memory system, comprising:

obtaining first check data by performing error correction coding on data in a first string area coupled to a first word line where a first redundant stripe is located and data in a second string area coupled to a second word line adjacent to the first word line, wherein the first string area and the second string area coupled to each of the word lines are located in different blocks, respectively, wherein the first redundant stripe corresponds to the first word line is configured to store first the check data; and when a plurality of data errors occur in a plurality of strings coupled to one of the word lines, performing correction by using the first check data stored in a redundant stripe corresponding to a corresponding word line and the first check data stored in a redundant stripe corresponding to a word line adjacent to the corresponding word line.

17. The operation method according to claim 16, further comprising:

obtaining second check data by performing error correction coding on one of data in the first string area or data in the second string area of the second word line corresponding to a second redundant stripe, wherein the second redundant stripe is configured to store the second check data; and when a plurality of data errors occur in a plurality of strings coupled to one of the word lines, performing correction by using the second check data and the first check data.

18. The operation method according to claim 17, comprising performing correction by using the first check data and the second check data stored in a redundant stripe corresponding to a corresponding word line.

19. The operation method according to claim 16, wherein the number of strings in the first string area is the same as the number of strings in the second string area.

20. The operation method according to claim 16, wherein the memory system comprises (N+1) word lines, each of the word lines is coupled to M strings, and each of the strings comprises L memory cells, and wherein a ratio of the number of memory cells occupied by the redundant stripe to the number of memory cells is (N+2) (M/2)/(N+1)*M*L.

* * * * *